United States Patent
Maeda

(10) Patent No.: US 10,541,284 B2
(45) Date of Patent: Jan. 21, 2020

(54) METHOD OF MANUFACTURING AN ORGANIC EL DISPLAY DEVICE AND ORGANIC EL DISPLAY DEVICE

(71) Applicant: Japan Display Inc., Minato-ku (JP)

(72) Inventor: Norihisa Maeda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/904,584

(22) Filed: Feb. 26, 2018

(65) Prior Publication Data

US 2018/0247986 A1   Aug. 30, 2018

(30) Foreign Application Priority Data

Feb. 27, 2017   (JP) .................................. 2017-035291

(51) Int. Cl.
*H01L 51/00* (2006.01)
*H01L 27/32* (2006.01)
*H01L 51/50* (2006.01)

(52) U.S. Cl.
CPC ...... *H01L 27/3246* (2013.01); *H01L 51/0015* (2013.01); *H01L 51/5056* (2013.01); *H01L 51/5072* (2013.01)

(58) Field of Classification Search
CPC ............. H01L 27/3244; H01L 27/3246; H01L 27/3283; H01L 51/0026
USPC ........................................ 438/82, 99; 257/40
See application file for complete search history.

(56) References Cited

U.S. PATENT DOCUMENTS

| | | | |
|---|---|---|---|
| 6,798,132 B2 * | 9/2004 | Satake | H01L 27/322 313/495 |
| 2011/0233572 A1 * | 9/2011 | Nakatani | H01L 27/3246 257/88 |
| 2013/0320323 A1 * | 12/2013 | Segawa | H01L 51/0023 257/40 |
| 2016/0013255 A1 | 1/2016 | Sato | |
| 2016/0254455 A1 * | 9/2016 | Wang | H01L 51/5234 438/23 |

FOREIGN PATENT DOCUMENTS

JP   2016-018759   2/2016

* cited by examiner

*Primary Examiner* — Long K Tran
(74) *Attorney, Agent, or Firm* — Oblon, McClelland, Maier & Neustadt, L.L.P.

(57) ABSTRACT

A method of manufacturing an organic EL display device according to an embodiment of the present invention includes: forming a plurality of lower electrodes respectively corresponding to a plurality of pixels on a substrate; forming a plurality of banks, which partition the pixels, between adjacent lower electrodes on the substrate; forming an organic material layer on the lower electrodes and the banks; and selectively irradiating the organic material layer on the banks with an energy ray from a direction of a surface of the organic material layer opposite to a surface of the organic material layer in contact with the banks.

8 Claims, 9 Drawing Sheets

METHOD OF MANUFACTURING AN ORGANIC EL DISPLAY DEVICE AND ORGANIC EL DISPLAY DEVICE

CROSS-REFERENCE TO RELATED APPLICATION

The present application claims priority from Japanese Application JP2017-35291 filed on Feb. 27, 2017. This application is hereby incorporated by reference into this application.

BACKGROUND OF THE INVENTION

1. Field of the Invention

The present invention relates to a method for manufacturing an organic EL display device and an organic EL display device.

2. Description of the Related Art

An organic electroluminescent (EL) display device includes a display panel having thin film transistors (TFTs) and organic light-emitting diodes (OLEDs) on a substrate, for example. The OLED includes an organic material layer between a pair of electrodes. The organic material layer is formed by laminating a hole transport layer, a light-emitting layer, and an electron transport layer, for example. Typically, such an organic material layer is formed in an area surrounded by a convex bank provided in advance for partitioning pixels. For example, a problem exists in that, when a conductive material such as a hole transport layer is provided common to plural pixels, a leak current flows between adjacent pixels. Specifically, the adjacent pixels emit light due to the leak current, which normally should not happen. This can cause color purity or contrast to be reduced. Such a problem can be remarkably observed as definition becomes higher (e.g., a distance between adjacent pixels becomes shorter) and drive voltage becomes lower (e.g., a high mobility material is adopted).

In order to solve the above described problems, Patent Literature 1 (JP2016-18759A) discloses that the organic material layer disposed on a bank is irradiated with an energy ray from a back side of a substrate in order to alter and passivate a conductive layer included in the organic material layer.

SUMMARY OF THE INVENTION

In Patent Literature 1, the energy ray is irradiated from the back side of the substrate using an electrode or a metal layer formed on the substrate as a mask. As such, an area irradiated with the energy ray depends on positions of the electrode and the metal layer.

In this regard, if an energy ray can be irradiated to a desired area, a leak current between adjacent pixels may be more securely controlled.

One or more embodiments of the present invention have been conceived in view of the above, and an object thereof is to provide a method for manufacturing an organic EL display device and an organic EL display device for more securely preventing a leak current between adjacent pixels.

1. A method of manufacturing an organic EL display device according to an embodiment of the present invention includes: forming a plurality of lower electrodes respectively corresponding to a plurality of pixels on a substrate; forming a plurality of banks, which partition the pixels, between adjacent lower electrodes on the substrate; forming an organic material layer on the lower electrodes and the banks; and selectively irradiating the organic material layer on the banks with an energy ray from a direction of a surface of the organic material layer opposite to a surface of the organic material layer in contact with the banks.

2. The method of manufacturing an organic EL display device according to the above-mentioned item 1 may further include forming a plurality of upper electrodes on the organic material layer after the organic material layer being irradiated with the energy ray.

3. In the method of manufacturing an organic EL display device according to the above-mentioned item 1, the organic material layer may include a hole transport layer.

4. In the method of manufacturing an organic EL display device according to the above-mentioned item 1, the organic material layer may be a hole transport layer.

5. In the method of manufacturing an organic EL display device according to the above-mentioned item 3 or 4, the energy ray may have a wavelength that is absorbable by the hole transport layer.

6. In the method of manufacturing an organic EL display device according to the above-mentioned item 1, the energy ray may be a laser beam.

7. The method of manufacturing an organic EL display device according to the above-mentioned item 1 may further include forming a mask on the organic material layer. In the irradiating step, the organic material layer on the banks may be selectively irradiated with ultraviolet light using the mask from a side of the organic material layer opposite to the banks.

8. An organic EL display device according to an embodiment of the present invention includes: a substrate; a plurality of lower electrodes that are disposed on the substrate and formed for respective pixels; a plurality of banks that are disposed between adjacent lower electrodes on the substrate and partition the pixels; an organic material layer that is disposed on the lower electrodes and the banks. The organic material layer on the banks includes an altered area where properties are altered.

9. In the organic EL display device according to the above-mentioned item 8, conductivity of the altered area may be lower than conductivity of the organic material layer on the lower electrode.

10. In the organic EL display device according to the above-mentioned item 8, the organic material layer may include a hole transport layer.

11. In the organic EL display device according to the above-mentioned item 8, the organic material layer may be a hole transport layer.

According to one or more embodiments of the present invention, a leak current between adjacent pixels of an organic EL display device can be more securely prevented.

DETAILED DESCRIPTION OF THE INVENTION

An embodiment of the present invention will be described below in detail with reference to the accompanying drawings.

In the following, the accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Figure 1:
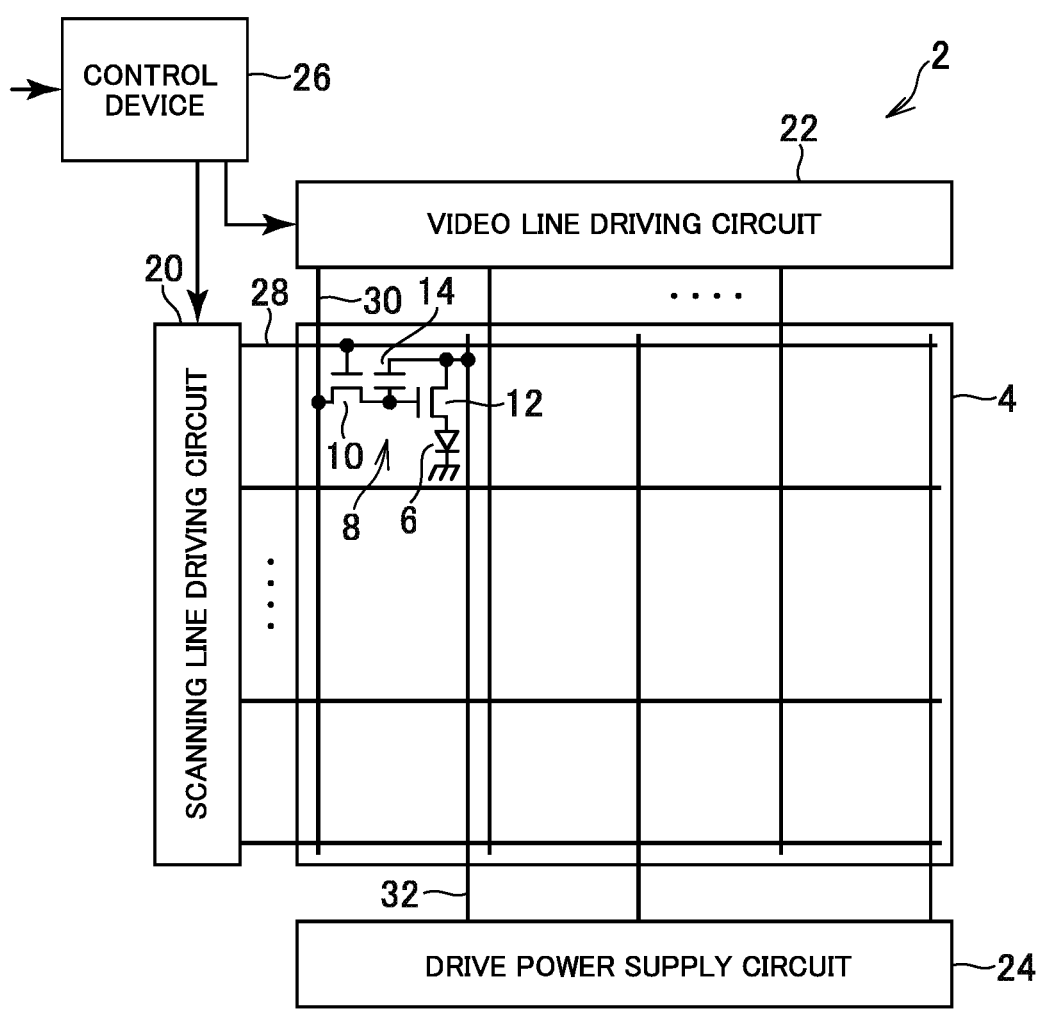
FIG. 1 is a schematic diagram of an organic EL display device according to this embodiment.

FIG. 1 is a schematic diagram of an organic EL display device 2 according to this embodiment. The organic EL display device 2 includes a pixel array section 4 that displays an image and a driving section that drives the pixel array section 4. The organic EL display device 2 includes a display panel having a laminate structure, such as TFTs and OLEDs, formed on a substrate. The schematic diagram shown in FIG. 1 is an example and this embodiment is not limited to this example.

OLEDs 6 and pixel circuits 8 are arranged in a matrix in correspondence with pixels in the pixel array section 4. Each of the pixel circuits 8 includes a plurality of TFTs 10 and 12, and a capacitor 14.

The driving section includes a scanning line driving circuit 20, a video line driving circuit 22, a drive power supply circuit 24, and a control device 26. The driving section drives the pixel circuits 8 and controls light emission of the OLEDs 6.

The scanning line driving circuit 20 is connected to scan signal lines 28 that are respectively provided to horizontal lines of pixels (pixel rows). The scanning line driving circuit 20 sequentially selects the scan signal lines 28 in response to timing signals from the control device 26, and applies voltage for turning on a turning-on TFT 10 to each of the selected scan signal lines 28.

The video line driving circuit 22 is connected to video signal lines 30 that are respectively provided to vertical lines of pixels (pixel columns). The video line driving circuit 22 receives video signals from the control device 26, and, in accordance with the scan signal line 28 selected by the scanning line driving circuit 20, outputs voltage corresponding to a video signal of the selected pixel to each of video signal lines 30. The voltage is written in the capacitor 14 at the selected pixel row through the turning-on TFT 10. A driver TFT 12 supplies an OLED 6 with current corresponding to the written voltage, and thereby the OLED 6 of the pixel corresponding to the selected scan signal line 28 emits light.

The drive power supply circuit 24 is connected to drive power source lines 32 respectively provided to the pixel columns, and supplies current to the OLED 6 through the drive power source lines 32 and the driver TFT 12 of the selected pixel row.

A lower electrode of an OLED 6 is connected to a driver TFT 12. An upper electrode of each OLED 6 is configured by a common electrode for all the pixels. If a lower electrode is configured as an anode, a high voltage is input to the lower electrode, and an upper electrode is configured as a cathode and a low voltage is input to the upper electrode. If a lower electrode is configured as a cathode, a low voltage is input to the lower electrode, and an upper electrode is configured as an anode and a high voltage is input to the upper electrode.

Figure 2:
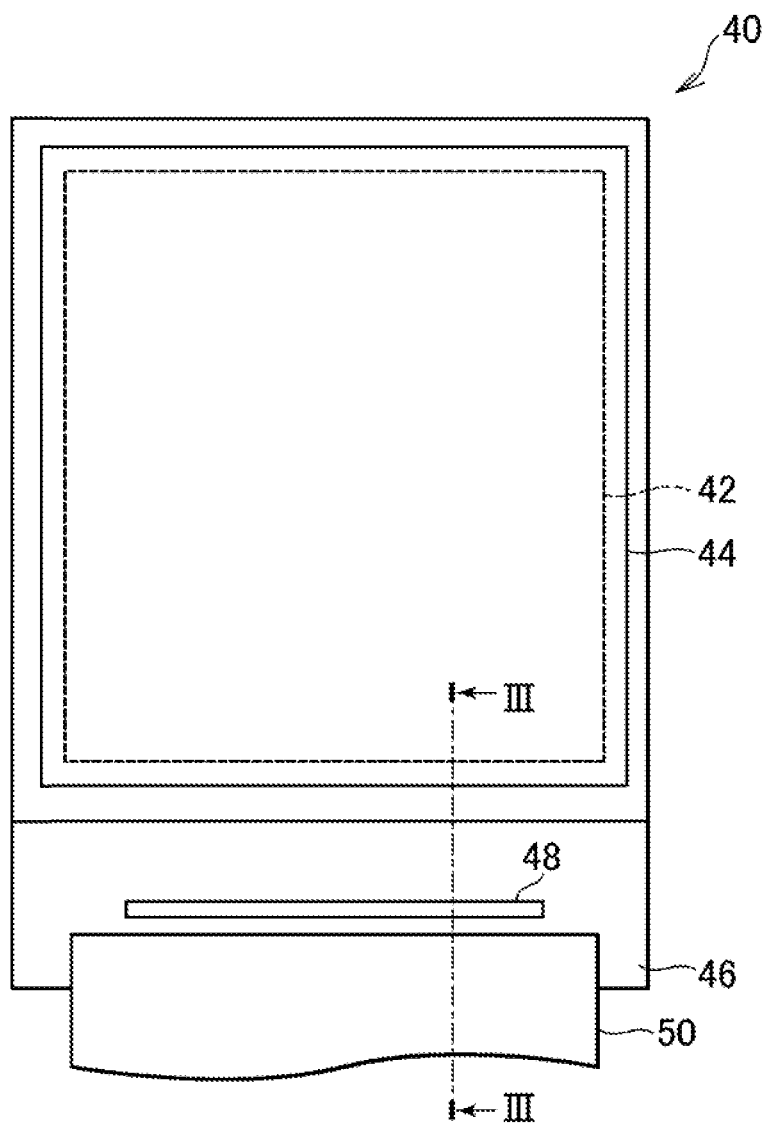
FIG. 2 is a schematic plan view of an example of a display panel of the organic EL display device shown in FIG. 1.

FIG. 2 is a schematic plan view of an example of a display panel of the organic EL display device 2 shown in FIG. 1. The pixel array section 4 shown in FIG. 1 is provided in the display area 42 of the display panel 40, and the OLEDs are arranged on the pixel array section 4 as described above. The upper electrodes 44 composing the OLEDs 6 are formed common to respective pixels as described above, and cover the entire display area 42.

One of the sides of the display panel 40, which is rectangular in shape, has a component mounting area 46. Wiring connecting to the display area 42 is disposed on the component mounting area 46. The component mounting area 46 includes a driver integrated circuit (IC) 48 composing the driving section, and an FPC 50 connected thereto. A flexible print substrate (FPC) 50 is connected to the control device 26 and other circuits 20, 22, and 24, for example, and includes an IC mounted thereon.

Figure 3:
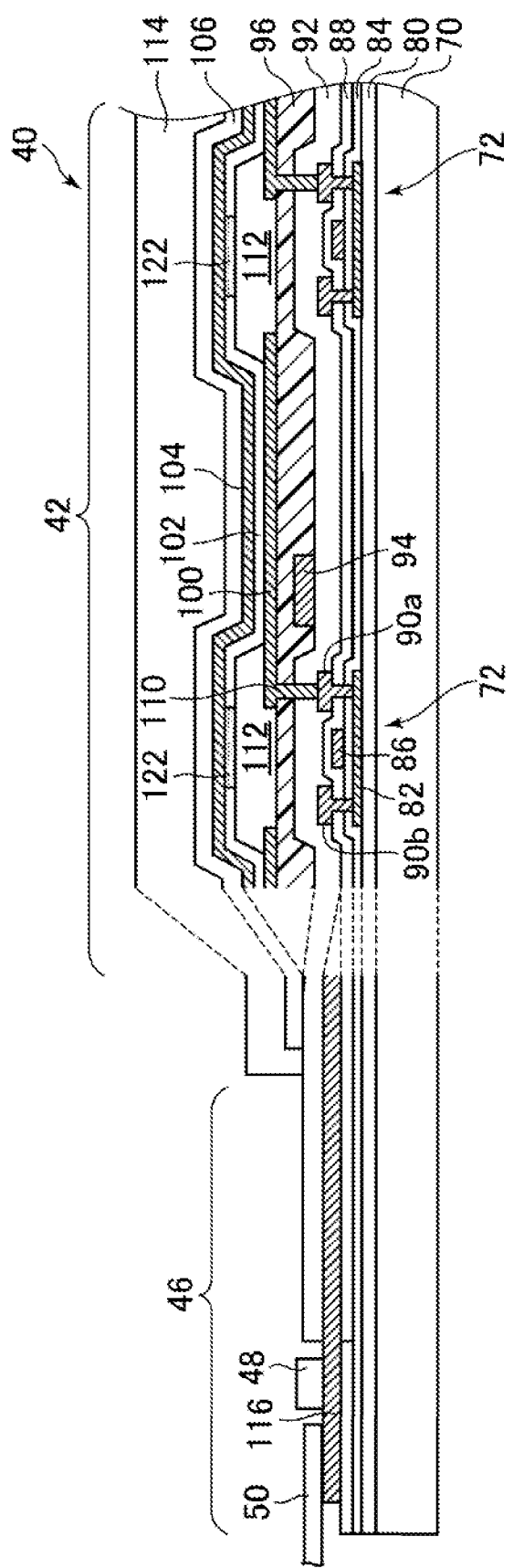
FIG. 3 is an example of a cross-sectional view of the display panel of FIG. 2 taken along the line III-III.

FIG. 3 is an example of a cross-sectional view of the display panel 40 of FIG. 2 taken along the line III-III. The display panel 40 is formed by, for example, laminating a circuit layer formed of TFTs 72 and the like, the OLDs 6 and a sealing layer 106 for sealing the OLEDs 6 on a substrate 70. The substrate 70 is formed of, for example, a glass plate and a resin film. In this embodiment, the pixel array section 4 is a top-emission type, and light generated in the OLED 6 is emitted to the side opposite to the substrate 70 side (upward direction in FIG. 3).

The circuit layer of the display area 42 includes the pixel circuit 8 described above, a scan signal line 28, a video signal line 30, and a drive power source line 32. At least a part of the driving section may be formed in an area adjacent to the display area 42 on the substrate 70 as a circuit layer. As described above, the driver IC 48 composing the driving section and the FPC 50 may be connected to the wiring 116 of the circuit layer in the component mounting area 46.

As shown in FIG. 3, a foundation layer 80 formed of an inorganic insulating material is disposed on the substrate 70. The inorganic insulating material includes, for example, silicon nitride ($SiN_y$), silicone oxide ($SiO_x$), and a complex thereof.

In the display area 42, a semiconductor area 82 that is a channel section and a source/drain section of a top gate TFT 72 is formed on the substrate 70 through the foundation layer 80. The semiconductor area 82 is formed of, for example, polysilicon (p-Si). The semiconductor area 82 is formed by, for example, disposing a semiconductor layer (p-Si film) on the substrate 70, and patterning the semiconductor layer to selectively leave a portion to be used for the circuit layer. A gate electrode 86 is disposed on a channel section of the TFT 72 through a gate insulating film 84. The gate insulating film 84 is typically formed of TEOS. The gate electrode 86 is formed by, for example, patterning a metal film formed by sputtering. An interlayer insulating layer 88 is disposed on the gate electrode 86 so as to cover the gate electrode 86.

The interlayer insulating layer 88 is formed of, for example, the inorganic insulating material described above. Impurities are introduced into the semiconductor area 82 (p-Si), which is a source/drain section of the TFT 72, by ion implantation, and a source electrode 90a and a drain electrode 90b that are electrically connected to thereto are formed to constitute the TFT 72.

An insulating interlayer 92 is disposed on the TFT 72. Wiring 94 is disposed on the surface of the insulating interlayer 92. The wiring 94 is formed by, for example, patterning a metal film formed by sputtering. With use of the metal film forming the wiring 94 and the metal film used for forming the gate electrode 86, the source electrode 90a, and the drain electrode 90b, for example, the wiring 116 and the scan signal line 28, the video signal line 30, and the drive power source line 32 shown in FIG. 1 can be formed in a multi-layered wiring structure. On this multi-layered wiring structure, a flattening film 96 is formed by using, for example, a resin material such as acrylic-based resin, and the OLED 6 is formed on the flattening film 96 in the display area 42.

The OLED 6 includes a lower electrode 100, an organic material layer 102, and an upper electrode 104. The organic material layer 102 is formed by, for example, laminating a hole transport layer, a light-emitting layer, and an electron transport layer. Typically, the OLED 6 is formed by laminating the lower electrode 100, the organic material layer 102, and the upper electrode 104 in this order from the substrate 70 side. In this embodiment, the lower electrode 100 is an anode of the OLED, and the upper electrode 104 is a cathode. The organic material layer 102 may include a layer other than the layers described above. Other layers include, for example, a hole injection layer and an electron block layer disposed between the anode and the light-emitting layer, and an electron injection layer and a hole block layer disposed between the cathode and the light-emitting layer.

If the TFT 72 shown in FIG. 3 is the drive TFT 12 having an n-channel, the lower electrode 100 is connected to the source electrode 90a of the TFT 72. Specifically, after the flattening film 96 is formed as described above, a contact hole 110 for connecting the lower electrode 100 with the TFT 72 is formed. For example, by patterning the surface of the flattening film 96 and a conductor part formed in the contact hole 110, a lower electrode 100 connected to the TFT 72 is formed for each pixel.

After the lower electrode 100 is formed, a bank 112 is formed on a pixel boundary. The bank 112 is formed of, for example, a resin material such as polyimide-based resin and acrylic-based resin. The lower electrode 100 is exposed in an effective area of a pixel surrounded by the bank 112. After the bank 112 is formed, the respective layers constituting the organic material layer 102 are sequentially laminated on the lower electrode 100 and the bank 112. The upper electrode 104 is formed on the organic material layer 102. The upper electrode 104 is formed of, for example, a transparent electrode material.

For example, a SiN$_y$ film is formed on the surface of the upper electrode 104 by a CVD method as the sealing layer 106. Further, a protective film 114 is laminated on the surface of the display area 42 in order to secure mechanical strength of the surface of the display panel 40. On the other hand, a protective film 114 is not laminated on the component mounting area 46 so as to readily connect to the IC and the FPC. The wiring of an FPC 50 and a terminal of the driver IC 40 are electrically connected to, for example, the wiring 116.

In this embodiment, the organic material layer 102 on the bank 112 includes an altered area 122 where properties are altered. Here, "properties of the organic material layer 102 are altered" means that, when altered and unaltered layers are compared to each other, the layers share the same multiple elements constituting the organic material layer 102 but their properties are different. Specifically, conductivity of the altered area 122 is lower than conductivity of the organic material layer 102 on the lower electrode 100. The altered area 122 is formed when the organic material layer 102 on the bank 112 is selectively irradiated with energy rays from the side opposite to the bank 112 (from a direction of a surface opposite to the surface of the organic material layer 102 in contact with the bank 112). The energy rays can alter or deteriorate organic molecules of the organic material layer 102, and include ultraviolet light, infrared light, electron beam, and high-intensity white light, for example. In this way, by irradiating energy rays, the organic material layer 102 on the bank 112 includes the altered area 122 having low conductivity. This configuration serves to prevent a leak current between adjacent pixels. In this regard, two or more layers constituting the organic material layer 102 may be altered to form the altered area 122, or one of the layers constituting the organic material layer 102 may be altered to form the altered area 122. For example, the altered area 122 may be formed by altering a hole transport layer, which has the lowest resistance and through which a current most readily flows of all the layers constituting the organic material layer 102. At this time, the energy rays preferably have a wavelength absorbable by the hole transport layer. The altered area 122 may be formed between all the pixels, or selectively formed around a specific pixel (for example, selectively formed around a G pixel whose color purity is being decreased due to a leak current remarkably among red (R), green (G), and blue (B) pixels).

Figure 4A:
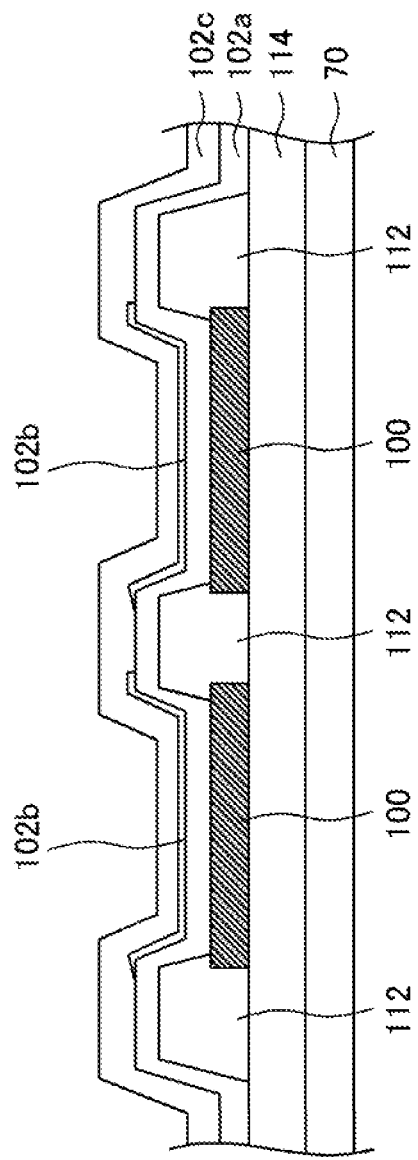
FIG. 4A is a diagram for explaining a first method for forming an altered area according to this embodiment.
Figure 4B:
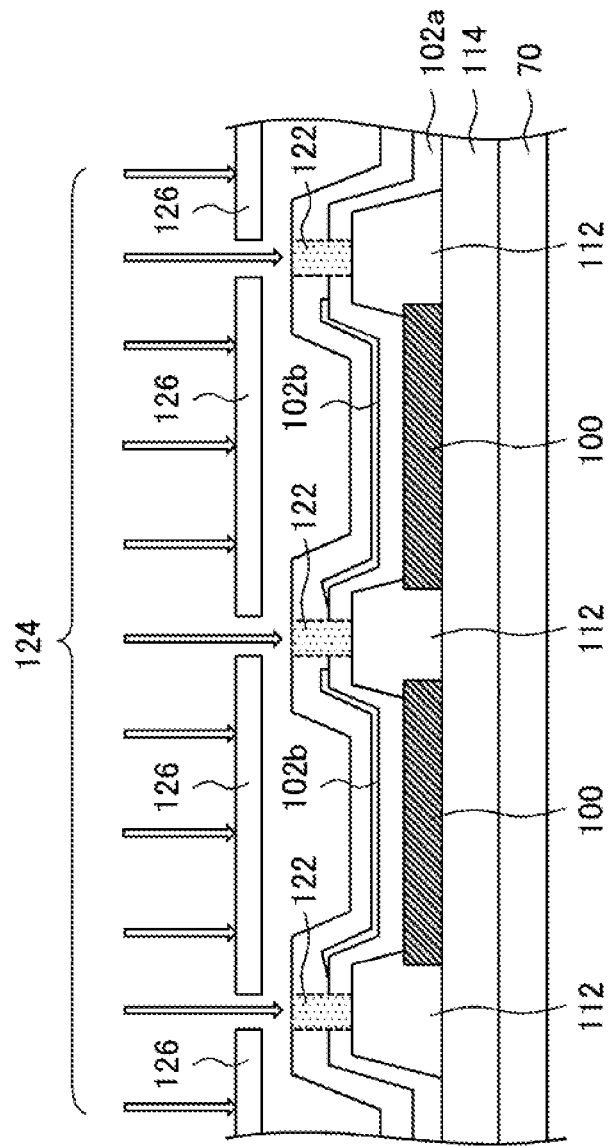
FIG. 4B is a diagram for explaining the first method for forming the altered area according to this embodiment.
Figure 4C:
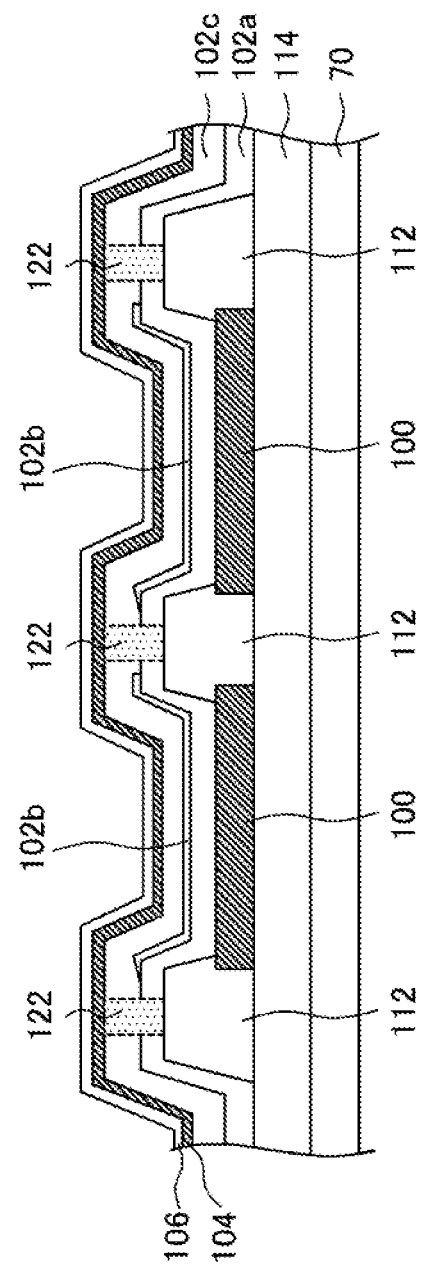
FIG. 4C is a diagram for explaining the first method for forming the altered area according to this embodiment.

Referring to FIGS. 4A to 4C, a first method for forming the altered area 122 according to this embodiment will be described. FIGS. 4A to 4C are schematic sectional views of the display panel 40 of the organic EL display device 2 according to this embodiment. In FIGS. 4A to 4C, a laminate structure of the display panel 40 shown in FIG. 3 from the foundation layer 80 on the substrate 70 to the flattening film 96 is simplified as an upper laminate structure 114. As shown in FIG. 4A, lower electrodes corresponding to respective pixels are formed on the substrate 70 (lower electrode forming step), banks 112 for partitioning a plurality of pixels are formed between adjacent lower electrodes 100 on the substrate 70 so as to protect edges of the lower electrodes 100 (bank forming step), and an organic material layer 102 is continuously formed over the lower electrodes 100 and the banks 112 (organic material layer forming step). For example, a hole transport layer 102a that includes compounds having a triphenylamine structure is continuously formed over the lower electrodes 100 and the banks 112 (provided in common for multiple pixels), a light-emitting layer 102b corresponding to each pixel color is formed in each pixel area on a hole transport layer 102a, and an electron transport layer 102c is formed so as to cover the light-emitting layer 102b (provided in common for multiple pixels) to form the organic material layer 102. In FIG. 4B, a mask 126 is formed on the organic material layer 102 (on the side opposite to the bank 112) (mask forming step). The mask 126 is formed, in plan view, so as to overlap the entire lower electrode 100 and not to overlap at least a part of the organic material layer 102 on the bank 112. With use of the mask 126, the organic material layer 102 on the bank 112 is selectively irradiated with energy rays from the side opposite to the bank 112 (irradiating step). In FIG. 4B, the energy rays are ultraviolet light 124. An area of the organic material layer 102 disposed on the bank 112 and irradiated with the ultraviolet light 124 (an area where the mask 126 is not formed in plan view) is altered and forms an altered area 122. As shown in FIG. 4C, after the energy rays (here, ultraviolet light 124) are irradiated, an upper electrode 104 is formed on the organic material layer 102 (upper electrode forming step). In other words, after an altered area 122 is formed in the organic material layer 102 on the bank 112 by irradiating the ultraviolet light 124 using the mask 126, the mask 126 is removed and an upper electrode 104 is formed on the organic material layer 102. Subsequently, a sealing layer 106 is formed on the upper electrode 104.

With the first method for forming the altered area 122 according to this embodiment, the mask 126 is formed on the organic material layer 102 (on the side opposite to the bank 112). As such, an area for forming the mask 126 can be relatively freely determined. With this configuration, it is possible to control a position and a size of an area to be irradiated with energy rays, that is, the altered area 122, according to an area in which the mask 126 is formed. As such, the altered area 122 can be formed on a desired position and in a desired size.

The area to be irradiated with energy rays may include at least a part of the organic material layer 102 on the bank 112, and may preferably be an area that overlaps the center point of the bank 112 in plan view.

In FIG. 4C, the ultraviolet light 124 is irradiated using the mask 126 after the organic material layer 102 is formed and before the upper electrode 104 is formed, although the ultraviolet light 124 may be irradiated using the mask 126, for example, after the hole transport layer 102a is formed. This can selectively alter the hole transport layer 102a through which a leak current readily flows.

The ultraviolet light 124 may be irradiated using the mask 126 after the upper electrode 104 is formed or the sealing layer 106 is formed. However, the sealing layer 106 may be altered if the ultraviolet light 124 is irradiated after the sealing layer 106 is formed. As such, in a case where the ultraviolet light 124 is irradiated after the sealing layer 106 is formed, it is preferred to irradiate ultraviolet light 124 having a wavelength that is not absorbable by the sealing layer 106 but absorbable by the organic material layer 102. This can selectively alter the organic material layer 102 without altering the sealing layer 106.

Figure 5A:
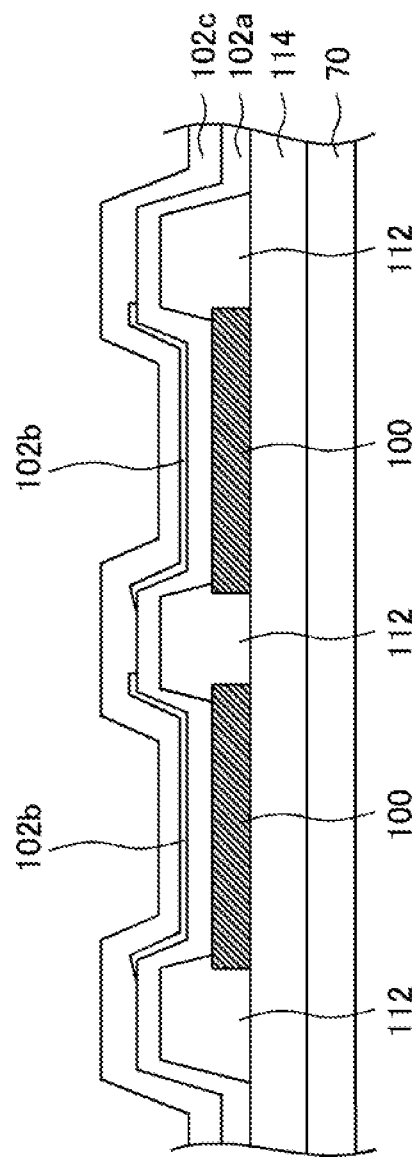
FIG. 5A is a diagram for explaining a second method for forming the altered area according to this embodiment.
Figure 5B:
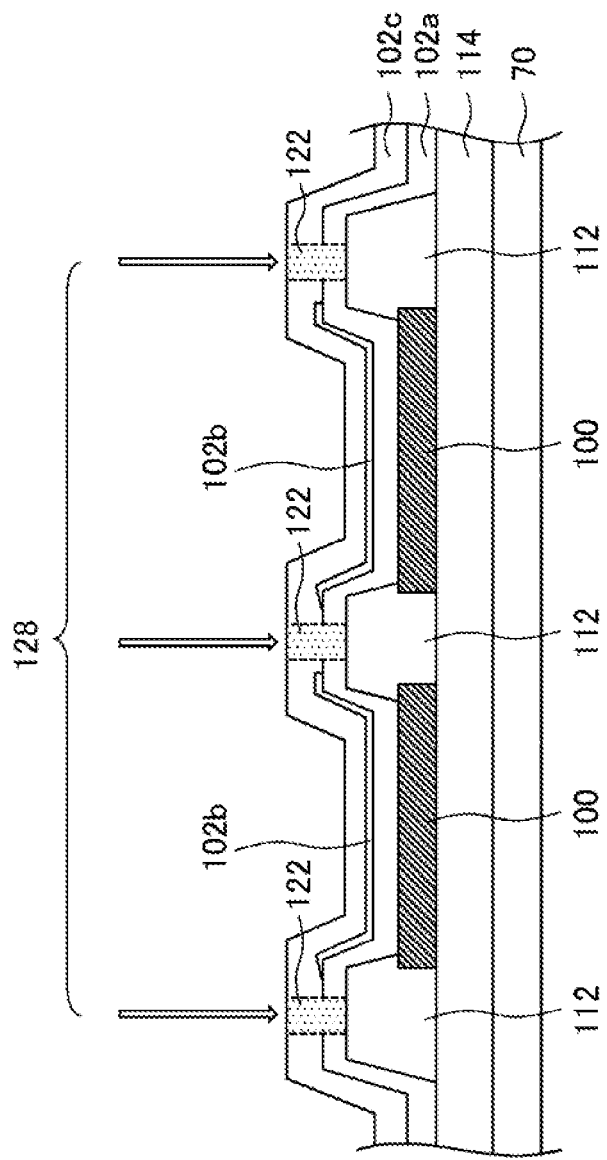
FIG. 5B is a diagram for explaining the second method for forming the altered area according to this embodiment.
Figure 5C:
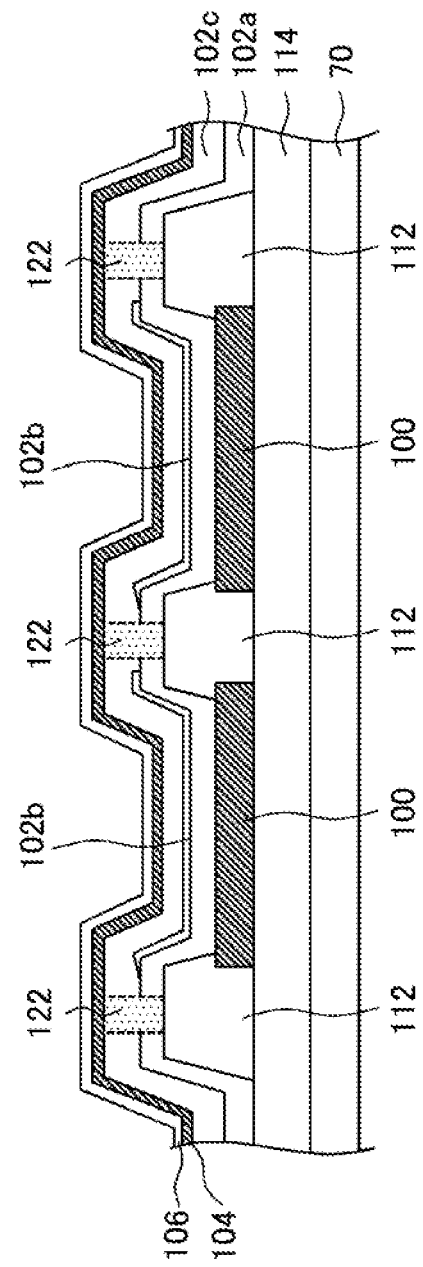
FIG. 5C is a diagram for explaining the second method for forming the altered area according to this embodiment.

Next, referring to FIGS. 5A to 5C, a second method for forming an altered area 122 according to this embodiment will be described. FIGS. 5A to 5C are schematic sectional views of the display panel 40 of the organic EL display device 2 according to this embodiment. In FIGS. 5A to 5C of a laminate structure of the display panel 40 shown in FIG. 3, a lamination from the foundation layer 80 on the substrate 70 to the flattening film 96 is simplified as an upper laminate structure 114. FIG. 5A is the same as FIG. 4A of the first method for forming the altered area 122 in this embodiment, and thus their overlapping explanation will be omitted. In FIG. 5B, the organic material layer 102 on the bank 112 is selectively irradiated with energy rays from the side opposite to the bank 112 (irradiating step). In FIG. 5B, the energy rays are laser beams 128. The laser beams 128 having high directivity are used as energy rays, and thus the organic material layer 102 on the bank 112 can be selectively irradiated with energy rays without using a mask. An area of the organic material layer 102 disposed on the bank 112 and irradiated with the laser beams 128 is altered and forms an altered area 122. As shown in FIG. 5C, after the energy rays (here, laser beams 128) are irradiated, an upper electrode 104 is formed on the organic material layer 102 (upper electrode forming step). In other words, after an altered area 122 is formed on the organic material layer 102 on the bank 112 by irradiating the laser beams 128, the upper electrode 104 is formed on the organic material layer 102. Subsequently, a sealing layer 106 is formed on the upper electrode 104.

In the second method for forming the altered area 122 according to this embodiment, the organic material layer 102 on the bank 112 is irradiated with laser beams from the side opposite to the bank 112, and thus it is possible to control a position and a size of an area to be irradiated with laser beams, that is, the altered area 122. As such, the altered area 122 can be formed on a desired position and in a desired size.

In FIG. 5B, the laser beams 128 are irradiated after the organic material layer 102 is formed and before the upper electrode 104 is formed, although the laser beams 128 may be irradiated after the hole transport layer 102a is formed, for example. This can selectively alter the hole transport layer 102a through which a leak current readily flows.

The laser beams 128 may be irradiated after the upper electrode 104 is formed. However, if the laser beams 128 are irradiated after the upper electrode 104 is formed, light intensity is reduced because the laser beams 128 pass through the upper electrode 104, and thus the organic material layer 102 may not be readily altered. As such, in a case where the laser beams 128 are irradiated after the upper electrode 104 is formed, a layer (e.g., metal layer) that readily absorbs the laser beams 128 may be formed on the bank 112 and under the organic material layer 102. This can readily alter the organic material layer 102 by the heat generated by the metal layer absorbing the laser beams 128. Alternatively, in a case where the laser beams 128 are irradiated after the upper electrode 104 is formed, the bank 112 may be formed of colored resin. The colored resin more readily absorb the laser beams 128 than transparent resin, and thus the organic material layer 102 is readily altered by the heat generated by the colored bank 112 absorbing the laser beams 128.

The laser beams 128 may be irradiated after the sealing layer 106 is formed, although the sealing layer 106 may be altered if the laser beams 128 are irradiated after the sealing layer 106 is formed. As such, in a case where the laser beams 128 are irradiated after the sealing layer 106 is formed, it is preferred to irradiate the laser beams 128 having a wavelength that is not absorbable by the sealing layer 106 but absorbable by the organic material layer 102. This can selectively alter the organic material layer 102 without altering the sealing layer 106.

In the process of selectively irradiating the organic material layer 102 on the bank 112 with the laser beams 128, the time required for the process can increase due to increase in the number of areas to be irradiated as definition of the organic EL display device 2 becomes higher. As such, in order to reduce the time required for the process, laser beams may be selectively irradiated around a specific pixel (e.g., selectively around a G pixel). Alternatively, a laser beam irradiation device that can irradiate more areas at one time may be used.

While the foregoing is directed to the embodiment of the invention, the present invention is not limited to the above described embodiment. For example, the configuration described in the embodiment may be replaced by any configurations that have substantially the same configuration as the configuration in the embodiment described above, provide the same effects as those of the embodiment described above, or achieve the same objective as that of the embodiment described above.

What is claimed is:

1. A method of manufacturing an organic EL display device, comprising:
    forming a plurality of lower electrodes respectively corresponding to a plurality of pixels on a substrate;
    forming a plurality of banks, which partition the pixels, between adjacent lower electrodes on the substrate;
    forming an organic material layer on the lower electrodes and the banks; and
    selectively irradiating the organic material layer on the banks with an energy ray from a direction of a surface of the organic material layer opposite to a surface of the organic material layer in contact with the banks,
    wherein an area to be irradiated with the energy ray is an area that overlaps one of the banks in plan view and is located outside an adjacent pixel.

2. The method of manufacturing the organic EL display device according to claim 1, further comprising
    forming a plurality of upper electrodes on the organic material layer after the organic material layer being irradiated with the energy ray.

3. The method of manufacturing the organic EL display device according to claim 1, wherein
    the organic material layer includes a hole transport layer.

4. The method of manufacturing the organic EL display device according to claim 1, wherein
    the organic material layer is a hole transport layer.

5. The method of manufacturing the organic EL display device according to claim 3, wherein
    the energy ray has a wavelength that is absorbable by the hole transport layer.

6. The method of manufacturing the organic EL display device according to claim 1, wherein
    the energy ray is a laser beam.

7. The method of manufacturing the organic EL display device according to claim 1, further comprising forming a mask on the organic material layer, wherein
    in the irradiating step, the organic material layer on the banks is selectively irradiated with ultraviolet light using the mask from a side of the organic material layer opposite to the banks.

8. The method of manufacturing the organic EL display device according to claim 1, wherein an altered area of the organic material layer is formed in the area that overlaps the bank in plan view and is located outside the pixel by selectively irradiating.

* * * * *